(12) United States Patent
Ahn et al.

(10) Patent No.: US 8,891,275 B2
(45) Date of Patent: Nov. 18, 2014

(54) STACKED DYNAMIC RANDOM ACCESS MEMORY

(71) Applicant: SNU R&DB Foundation, Seoul (KR)

(72) Inventors: Jin-Hong Ahn, Yongin-si (KR); Young-June Park, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 14/062,956

(22) Filed: Oct. 25, 2013

(65) Prior Publication Data

US 2014/0119090 A1   May 1, 2014

(30) Foreign Application Priority Data

Oct. 25, 2012   (KR) ........................ 10-2012-0118886

(51) Int. Cl.
  *G11C 5/02*   (2006.01)
  *G11C 5/06*   (2006.01)
  *G11C 11/4097*   (2006.01)

(52) U.S. Cl.
  CPC   *G11C 5/02* (2013.01); *G11C 5/063* (2013.01); *G11C 11/4097* (2013.01)
  USPC ............................................ 365/51; 365/205

(58) Field of Classification Search
  USPC .................................................. 365/51, 205
  See application file for complete search history.

(56) References Cited

U.S. PATENT DOCUMENTS

| 6,303,923 | B1 * | 10/2001 | Wadsworth et al. | ..... 250/214 LA |
| 6,950,217 | B2 * | 9/2005 | Richards | ........................ 359/238 |
| 2009/0243115 | A1 * | 10/2009 | Lee et al. | ........................ 257/773 |

FOREIGN PATENT DOCUMENTS

| KR | 10-2005-0072838 A | 7/2005 |
| KR | 10-2011-0129254 A | 12/2011 |

* cited by examiner

*Primary Examiner* — Michael Tran
(74) *Attorney, Agent, or Firm* — Sherr & Jiang, PLLC

(57) ABSTRACT

A memory includes at least one first substrate on which unit memory arrays are disposed as a matrix type, each unit memory array including unit memory cells disposed in an array, a second substrate stacked with the at least one first substrate, the second substrate including a sense amplifier region in which sense amplifiers configured to sense information stored in the unit memory cells are disposed, and a plurality of vertical conduction traces configured to electrically connect the at least one first substrate with the second substrate. The sense amplifier region is disposed in a memory region of the second substrate, wherein the memory region of the second substrate corresponds to the memory region of the first substrate.

20 Claims, 12 Drawing Sheets

STACKED DYNAMIC RANDOM ACCESS MEMORY

CROSS-REFERENCE TO RELATED APPLICATION

This application claims priority to and the benefit of Korean Patent Application No. 10-2012-0118886, filed Oct. 25, 2012, the disclosure of which is incorporated herein by reference in its entirety.

BACKGROUND

The present invention relates to a stacked dynamic random access memory (DRAM).

Discussion of Related Art

A dynamic random access memory (DRAM) may include a capacitor formed in an integrated circuit (IC), and be used as an information storage device. The capacitor may be in a charged state or a discharged state, which may typically indicate one binary bit of 0 or 1. Since the capacitor leaks charges, as long as the capacitor is not refreshed periodically, information stored in the capacitor may end up being lost. Accordingly, since the memory including the capacitor needs to be periodically refreshed, it is referred to as a DRAM.

Since a DRAM needs only a single transistor and a single capacitor to store one binary bit, the DRAM may have a high integration density and be easily configured. A single transistor and a single information storage element, which can store one binary bit, are referred to as a unit memory cell, and unit memory cell arrays, each of which is arranged in an array, may be arranged as a matrix type to form a memory. A line configured to transmit a driving signal required to turn on or turn off a transistor included in a unit memory cell within a unit memory array is referred to as a word line, and a line configured to transmit information stored in an information storage element when the unit memory cell is turned on is referred to as a bit line. Word lines may be electrically connected to word line drivers included in a word line driving region, and bit lines may be electrically connected to a sense amplifier so that the sense amplifier determines whether information stored in the unit memory cell is binary data "0" or "1" and outputs the corresponding information. A typical memory may further include a logic unit and a refresh circuit configured to decode a control signal of a memory cell or control power.

SUMMARY OF THE INVENTION

In a conventional dynamic random access memory (DRAM), memory cells may be arranged on a single-layer substrate in a rectangular array, a word line driver is formed on one side facing one side of a memory array, a sense amplifier is arranged on the other side facing the other side of the memory array, and a logic unit is arranged near each of angular points of the rectangular array.

With the increased demand for high density integration and high information density of memories, the integration density of memory cells has increased, and accordingly, an area occupied by a capacitor serving as an information storage element has been reduced. To compensate the capacitance, which is proportional to the reduced area, the height of the capacitor has increased too having high aspect ratio. During formation of a memory having a high aspect ratio, process complexity may increase, and yield may be reduced and functional failure rate may increase. For example, capacitors may lean, and failures such as storage node bridges, etc. may occur between adjacent capacitors. As a result, horizontal downscaling has reached technical limits.

The present invention is directed to providing a structure of a stacked DRAM having a higher information density using memory array.

The present invention is directed to providing a method of forming lines applicable to a stacked DRAM having a higher information density.

One aspect of the present invention provides a memory including: at least one first substrate on which unit memory arrays are disposed in a memory region as a matrix type, each unit memory array including unit memory cells disposed in an array, a second substrate stacked with the at least one first substrate, the second substrate including a sense amplifier region in which sense amplifiers configured to sense information stored in the unit memory cells are disposed, and a plurality of vertical conduction traces configured to electrically connect the at least one first substrate with the second substrate. The sense amplifier region is disposed in a memory region of the second substrate. The memory region of the second substrate corresponds to the memory region of the first substrate.

Another aspect of the present invention provides a memory including: at least one first substrate on which unit memory arrays are disposed in a memory region of first substrate as a matrix type, each unit memory array in which unit memory cells are disposed in an array, and a second substrate having sense amplifier region in which sense amplifiers that sense information stored in unit memory cells are disposed within a memory region of the second substrate. At least one bit line of bit lines disposed in the sense amplifier region is electrically connected to the sense amplifiers disposed in the sense amplifier region, through vertical conduction traces, and the remaining bit lines are electrically connected to sense amplifiers disposed in a sense amplifier region disposed adjacent to the sense amplifier region in which the at least one bit line is disposed. The memory region of the second substrate corresponds to the memory region of the first substrate.

Another aspect of the present invention provides a memory including: a plurality of first substrates, each first substrate on which unit memory arrays are disposed in a memory region of each first substrate as a matrix type, each unit memory array including unit memory cells and word lines configured to drive the unit memory cells, and a second substrate stacked with the plurality of first substrates and including memory regions of the second substrate between which a word line driver region is disposed in a direction in which the word lines extend. The word lines are electrically connected to two adjacent unit memory arrays and electrically connected to word line drivers of the word line driver region disposed between the two adjacent memory regions, through vertical conduction traces. A position of the memory region of the first substrate and a position of the memory region of the second substrate corresponds to each other.

Still another aspect of the present invention provides a memory including: a plurality of first substrates, each first substrate on which unit memory arrays are disposed in a memory region of the first substrate as a matrix type, each unit memory array including unit memory cells and word lines configured to drive the unit memory cells, and a second substrate stacked with the plurality of first substrates, the second substrate including a plurality of word line driver regions divided parallel to a direction in which the word lines extend, and disposed in a memory region of a memory region of the second substrate. The word lines are electrically connected to two adjacent unit memory arrays, and electrically connected to any one word line driver disposed in a memory region of the adjacent unit memory arrays, through vertical conduction traces. A position of the memory region of the first substrate and a position of the memory region of the second substrate corresponds to each other.

Still another aspect of the present invention provides a memory including: a plurality of first substrates, each first substrate on which unit memory arrays are disposed in a memory region of the first substrate as a matrix type, each unit memory array including unit memory cells and word lines configured to drive the unit memory cells, a second substrate stacked with the plurality of first substrates, the second substrate including memory regions disposed parallel to each other. A word line driver region in which word line drivers are disposed is interposed between the memory regions of the second substrate, and a vertical conduction trace interposed between two adjacent unit memory arrays and configured to electrically connect the word line with the word line driver of the word line driver region. The word line is electrically connected to the two adjacent unit memory arrays, and a tap is formed in one direction from a direction in which the word lines extend, and connected to the vertical conduction trace. A position of the memory region of the first substrate and a position of the memory region of the second substrate corresponds to each other.

Still another aspect of the present invention provides a memory including: a plurality of first substrates, each first substrate on which unit memory arrays are disposed in a memory region of the first substrate as a matrix type, each unit memory array including unit memory cells and word lines configured to apply driving signals configured to drive the unit memory cells, a second substrate stacked with the plurality of first substrates, the second substrate including a plurality of word line driver regions divided parallel to a direction in which the word lines extend, and disposed in a memory region of the second substrate, and a vertical conduction trace configured to electrically connect the word line with the word line driver disposed in the memory region. The word lines are electrically connected to two adjacent unit memory arrays, and a tap is formed in one direction from a direction in which the word lines extend, and connected to the vertical conduction trace. A position of the memory region of the first substrate and a position of the memory region of the second substrate corresponds to each other.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 9A through 12B are diagrams illustrating a memory region of a second substrate on which a sense amplifier region, a word line driver region, and a logic region are disposed as a matrix type and word lines formed on a first substrate, according to an exemplary embodiment of the present invention.

DETAILED DESCRIPTION OF EMBODIMENTS

The present invention will now be described more fully hereinafter with reference to the accompanying drawings, in which exemplary embodiments of the present invention are shown. This invention may, however, be embodied in different forms and should not be construed as limited to the embodiments set forth herein. Rather, these embodiments are provided so that this disclosure is thorough and complete and fully conveys the scope of the present invention to one skilled in the art.

Figure 1:
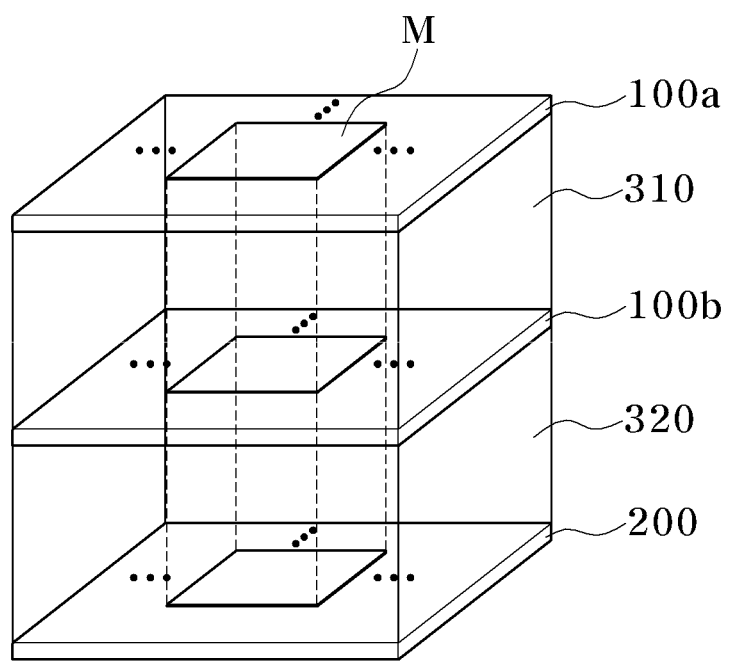
FIG. 1 is a schematic perspective view of a memory according to an exemplary embodiment of the present invention.
Figure 2:
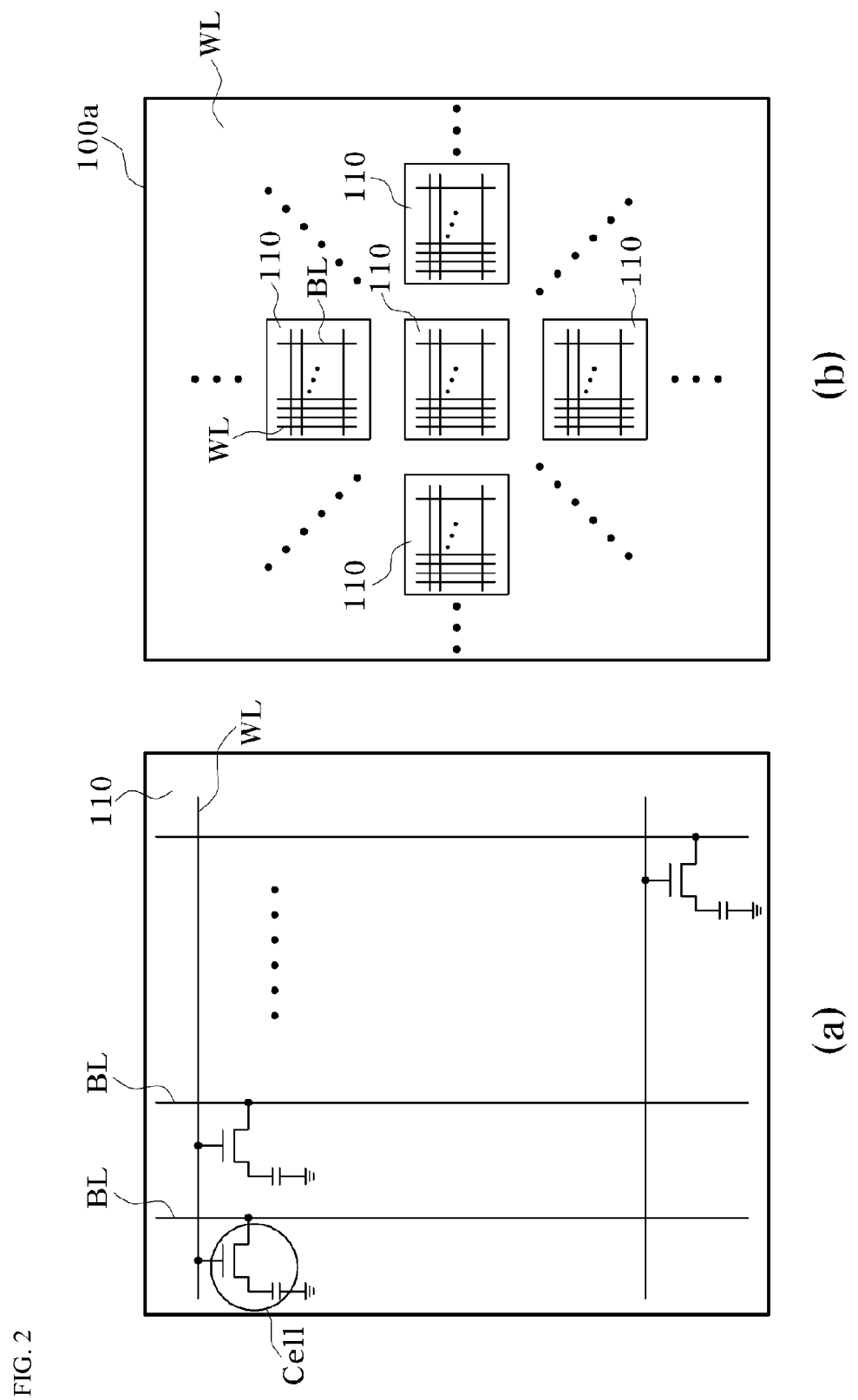
FIGS. 2A and 2B are diagrams showing arrangement of a memory on a first substrate according to an exemplary embodiment of the present invention.

Hereinafter, a memory according to an exemplary embodiment of the present invention will be described with reference to the appended drawings. FIG. 1 is a schematic perspective view of a memory according to an exemplary embodiment of the present invention, FIGS. 2A and 2B are diagrams showing arrangement of a memory on a first substrate according to an exemplary embodiment of the present invention. The memory according to the exemplary embodiment of the present invention may include at least one first substrate on which unit memory arrays are disposed as a matrix type, a second substrate stacked with the at least one first substrate and including a sense amplifier region in which sense amplifiers configured to sense information stored in memory cells are disposed, and a plurality of vertical conduction traces configured to electrically connect the at least one first substrate with the second substrate. The sense amplifier region may be disposed in the memory region of the second substrate, wherein the memory region of the second substrate corresponds to the memory region of the first substrate.

Referring to FIGS. 1, 2A, and 2B, a memory according to an exemplary embodiment of the present invention may be formed by stacking at least one first substrate 100a or 100b with a second substrate 200. In one embodiment, the first substrates 100a and 100b and at least one second substrate 200 may be stacked by interposing insulating layers 310 and 320 therebetween. In the present specification, the illustration of an insulating layer is omitted for brevity, and only reference numerals are used. In an example, as shown in FIG. 1, the memory according to the exemplary embodiment of the present invention may include a second substrate 200 disposed at a lower end, and first substrates 100a and 100b may be stacked with the second substrate 200. In another example, although not shown, the second substrate 200 may be interposed between the first substrates 100a and 100b according to an exemplary embodiment of the present invention. Hereinafter, an example that the first substrate 100a and the first substrate 100b are stacked with the second substrate 200 will be explained for convenience and clarity of explanation. However, the example is provided only for convenience and clarity and not for the purpose of limitation of the scope of the present invention. Accordingly, the second substrate 200 may be disposed between the first substrate 100a and the first substrate 100b, and the second substrate 200 may be disposed at a top end. Therefore, "a second substrate stacked with the at least one first substrate" should be understood as a second substrate could be interposed between first substrates or a second substrate could be either top or bottom of the stacked substrates. Also, although an example that the number of the stacked first substrates is 2 will be explained, this example is provided only for convenience and clarity and not for the purpose of limitation of scope of the present invention. Accordingly, three or more first substrates may be stacked.

Referring to FIGS. 2A and 2B, unit memory arrays, each of which includes unit memory cells disposed in an array, may be disposed as a matrix type on each of the first substrates 100a and 100b. Referring to FIG. 2A, a plurality of unit memory cells Cell, word lines WL configured to transmit driving signals to the plurality of memory cells, and bit lines BL configured to transmit information stored in the memory cells may be disposed in the unit memory array 110. As shown in FIG. 2B, the unit memory arrays 110 may be disposed as a matrix type on each of the first substrates 100a and 100b. In an exemplary embodiment, the first substrates 110a and 110b may be vertically stacked. As shown in FIG. 1, each of the first substrates 100a and 100b may be disposed and stacked such that matrices of the memory arrays 110 correspond to one another. In an example, when a bit line contact of the first substrate 100a disposed at an upper end is formed and a via is vertically formed, the bit line contact of the first substrate 100a may be electrically connected to a bit line contact of the first substrate 100b formed at a lower end.

Hereinafter, a region in which a unit memory array of each of the first substrate 100a and the first substrate 100b stacked in an aligned manner is located will be defined as a first-substrate memory region, and a region of the second substrate 200 corresponding to the first-substrate memory region will be defined as a second-substrate memory region. That is, the unit memory arrays 110 of the first substrates 100a and 100b may be located directly upward to the second-substrate memory region. Also, the second-substrate memory region simply indicates that the unit memory array is located in the corresponding region of each of the first substrates 100a and 100b. Thus, it should not be misunderstood that a memory array is located in the second-substrate memory region.

Figure 3:
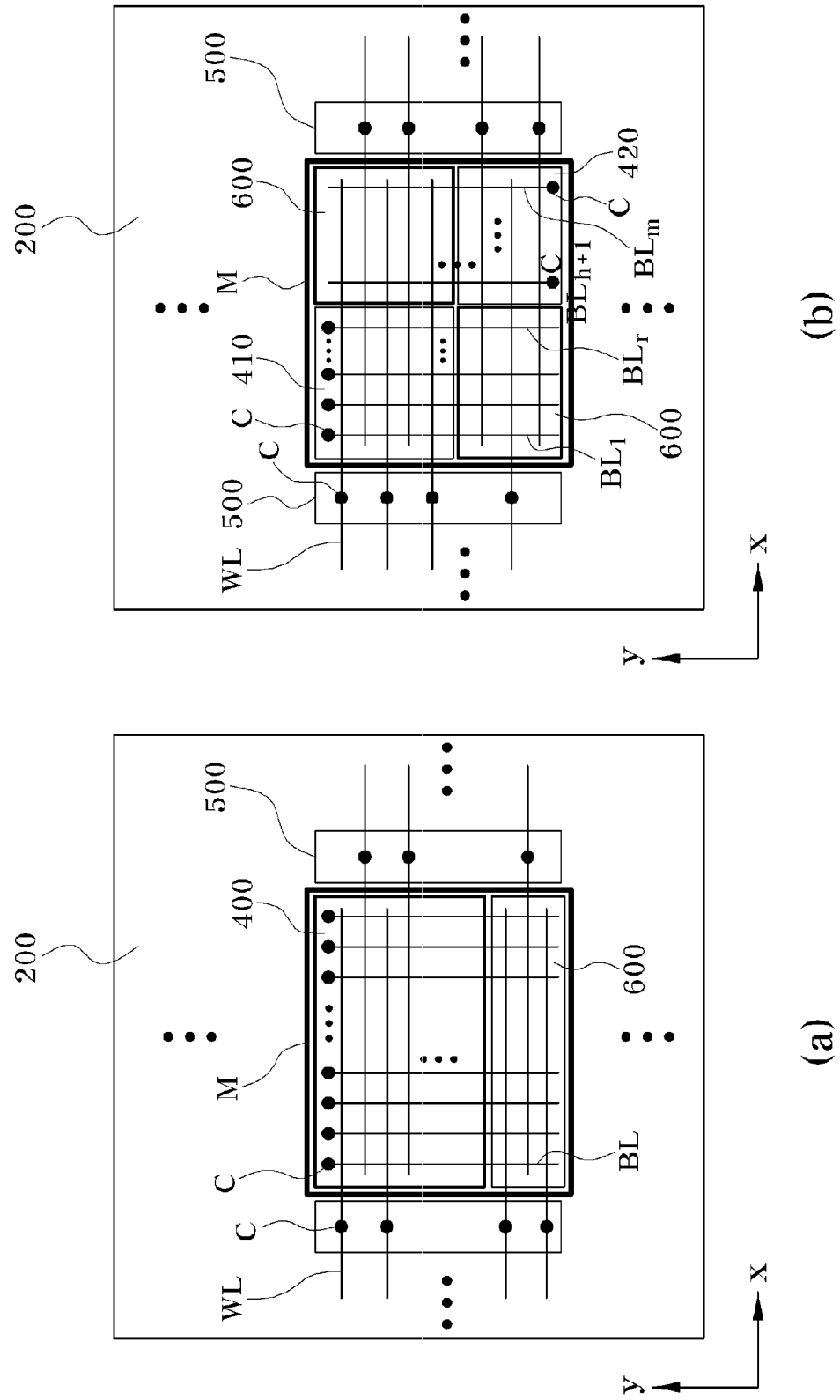
FIGS. 3A, 3B, and 4 are top views of a second substrate according to an exemplary embodiment of the present invention.

FIGS. 3A and 3B are top views of the second substrate 200. Referring to FIGS. 2A, 2B, 3A and 3B, a sense amplifier region 400 and a logic region 600 may be disposed in the second substrate 200. Sense amplifiers configured to sense information stored in memory cells may be disposed in the sense amplifier region 400, and logic circuits may be disposed in the logic region 600. In one embodiment, a word line driver region 500 may be further disposed in the second substrate 200. Word line drivers configured to apply driving signals to the memory cells through word lines WL may be disposed in the word line driver region 500. Although bit lines BL and the word lines WL are illustrated in FIGS. 3A and 3B for brevity, the bit lines BL and the word lines WL are actually formed on the first substrates 100a and 100b. As shown in FIGS. 3A and 3B, the bit lines BL and the word lines WL may be electrically connected to the sense amplifiers and the word line drivers, respectively, through vertical conduction traces C.

In one embodiment, as shown in FIG. 3A, the sense amplifier region 400 may be disposed in a memory region M of the second substrate 200 so that bit lines of a plurality of memory cells connected to the same sense amplifier can have the same length. When bit lines of a plurality of memory cells connected to one sense amplifier have different lengths, the sense amplifier may exhibit different line resistances and different line capacitances. Thus, errors may occur while the sense amplifier is sensing values of information stored in the memory cells. The logic circuits may be disposed in the logic region 600. The logic circuits may be electrically connected to the word line drivers and the sense amplifiers through local interconnections (not shown) and supply power to the word line drivers and sense amplifiers or apply control signals.

In another embodiment, as shown in FIG. 3B, sense amplifier regions 410 and 420 may be divided from each other in a direction parallel to a direction in which bit lines BL extend, and disposed in a memory region M of the second substrate 200. The sense amplifier regions 410 and 420 may be separately disposed in the memory region M of the second substrate 200 so that bit lines BL of memory cells connected to the same sense amplifier can have the same length. Explaining the arrangement using two-dimensional coordinates shown in FIG. 3B, when bit lines $BL_1$ to $BL_m$ extend along a y-axis and are arranged parallel to one another along an x-axis in one memory region M, first and second sense amplifier regions 410 and 420 may be divided from each other in a direction in which bit lines extend, and spaced apart from each other in the memory region M such that the first sense amplifier region 410 is electrically connected to bit lines $BL_1$ to $BL_n$, and the second sense amplifier region 420 is electrically connected to bit lines $BL_{n+1}$ to $BL_m$.

Hereinafter, in the present specification, directions will be indicated as follows. Referring to FIGS. 3A and 3B, bit lines extend along the y-axis. Thus, a y-axis direction may be defined as a direction in which the bit lines extend. Also, a plurality of bit lines are arranged parallel to one another along the x-axis. Thus, an x-axis direction may be defined as a direction in which the bit lines are arranged. Accordingly, in FIGS. 3A and 3B, it can be seen that a direction in which word lines extend is the x-axis direction, and a direction in which the word lines are arranged is the y-axis direction. However, it should be noted that the direction in which the bit lines extend may not necessarily be perpendicular to the direction in which the word lines extend, and the illustrations are provided only for convenience of explanation.

In an exemplary embodiment, the word line driver region 500 may be disposed between memory regions disposed as a matrix type in the direction in which the word lines extend. A logic circuit disposed in the logic region 600 may be electrically connected to the sense amplifier region (refer to 400 in FIG. 3A and 410 and 420 in FIG. 3B) and the word line driver region 500 and supply power or apply a control signal. The logic circuit may supply power or apply the control signal into the same substrate or the same memory region through a local interconnection (not shown).

When the sense amplifier region (refer to 400 in FIG. 3A and 410 and 420 in FIG. 3B) and the word line driver region 500 are disposed as shown in FIGS. 3A and 3B, the bit lines or word lines may be formed at regular intervals parallel to one another without cutting the bit lines or the word lines or forming the bit lines or the word lines in a roundabout way. In the present embodiment, when a plurality of first substrates are stacked, the sense amplifier region (refer to 400 in FIG. 3A and 410 and 420 in FIG. 3B) and the logic region 600 are disposed in the memory region M of the second substrate 200, a die size may be reduced by as much as the sense amplifier region 400 (or 410 and 420) and the logic region 600 as compared with a related art. Furthermore, since a sufficient space for sense amplifiers may be provided, sense amplifiers capable of precisely operating at a higher speed may be formed.

Hereinafter, a memory according to an exemplary embodiment of the present invention will be described with reference to FIG. 4. Here, a repeated description for the same configuration and arrangement as the memory according to the embodiments described above will be omitted for convenience and clarity.

Figure 4:
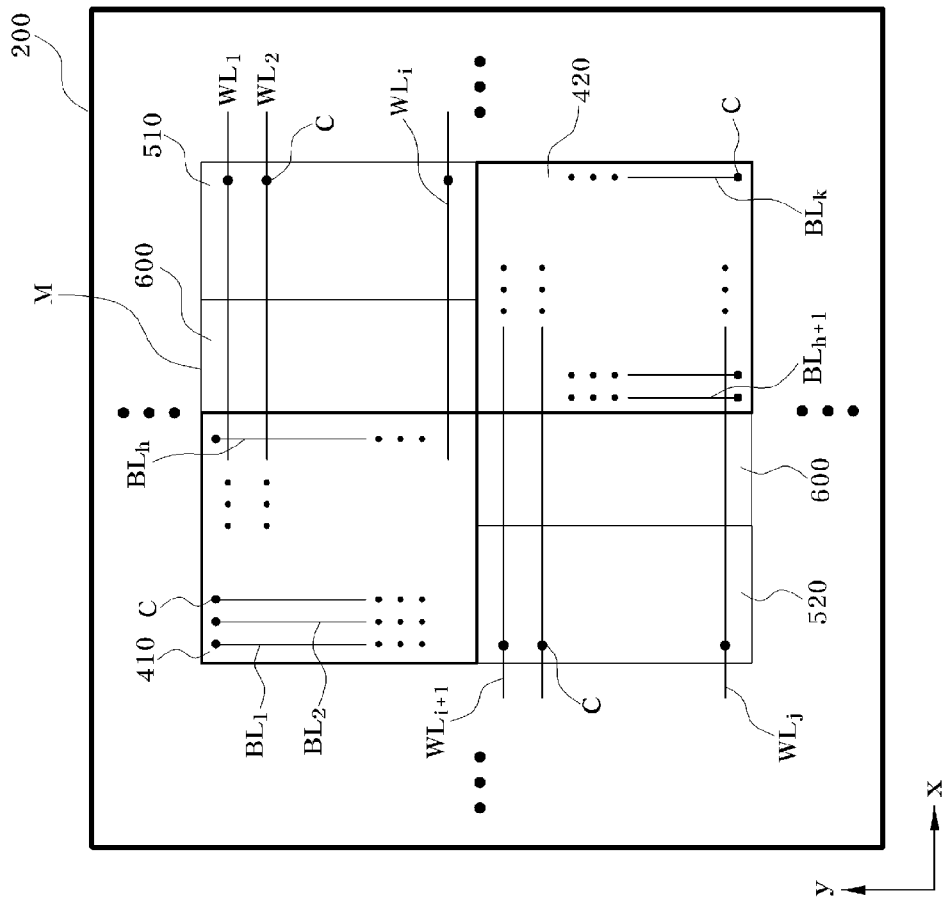

FIG. 4 is a top view of a second substrate 200 according to an exemplary embodiment of the present invention. Referring to FIGS. 2A, 2B, and 4, sense amplifier regions 410 and 420, word line driver regions 510 and 520, and a logic region 600 may be disposed in a memory region M of the second substrate 200. Sense amplifiers configured to sense information stored in memory cells may be disposed in the sense amplifier regions 410 and 420. Word line drivers configured to apply driving signals to the memory cells through word lines WL may be disposed in the word line driver regions 510 and 520. Logic circuits may be disposed in the logic region 600. In one embodiment, although bit lines BL and word lines WL are illustrated in FIG. 4 for brevity, the bit lines BL and the word lines WL are actually formed on first substrates 100a and 100b. As shown in FIG. 4, the bit lines BL and the word lines WL may be electrically connected to the sense amplifiers and the word line drivers, respectively, through vertical conduction traces C.

In one embodiment, as shown in FIG. 4, the word line driver regions 510 and 520 may be divided from each other in a direction parallel to a direction in which the word lines WL extend, and disposed in a memory region M of the second substrate 200, and the sense amplifier regions 410 and 420 may be divided from each other in a direction parallel to a direction in which the bit lines BL extend, and disposed in the memory region M of the second substrate 200.

In an example, when word line driver regions are divided in the direction in which the word lines WL extend, along a space between two adjacent word lines $WL_i$ and $WL_{i+1}$, and the divided word line driver regions are disposed apart from each other in the memory region M of the second substrate 200, the word lines WL may be arranged at regular intervals parallel to one another in the direction in which the word lines WL are arranged. Also, when sense amplifier regions are divided in the direction in which the bit lines BL extend, along a space between two adjacent bit lines $BL_h$ and $BL_{h+1}$, and the divided sense amplifier regions are disposed apart from each other in the memory region M of the second substrate 200, the bit lines BL may be arranged at regular intervals parallel to one another in the direction in which the bit lines BL are arranged.

In the present embodiment, when word lines WL1 to $WL_j$ are arranged, one word line driver region 510 disposed apart may be electrically connected to the word lines $WL_1$ to $WL_i$ and drive memory cells connected to the corresponding word lines, while another word line driver region 520 disposed apart may be electrically connected to the word lines $WL_{i+1}$ to $WL_j$ and drive memory cells connected to the corresponding word lines. Accordingly, even if the word line driver regions 510 and 520 are disposed apart from each other in the same memory region, the word line driver regions 510 and 520 may be electrically connected to all the word lines disposed in the corresponding memory region, and the word lines may be arranged at regular intervals, so the integration density of a memory may not be degraded.

The divided sense amplifier regions 410 and 420 may be divided from each other in the direction in which the bit lines BL extend, and be disposed apart from each other in the memory region M. When bit lines $BL_1$ to $BL_k$ are arranged, one sense amplifier region 410 disposed apart may be electrically connected to the bit lines $BL_1$ to $BL_h$ and sense information stored in memory cells connected to the corresponding bit lines, while another sense amplifier region 420 disposed apart may be electrically connected to the bit lines $BL_{h+1}$ to $BL_k$ and sense information stored in memory cells connected to the corresponding bit lines. Accordingly, even if the sense amplifier regions 410 and 420 are divided in the direction in which the bit lines BL extend, and be disposed apart from each other in one memory region of the second substrate 200, the sense amplifier regions 410 and 420 may be electrically connected to all the bit lines of the corresponding first substrate, and the bit lines BL may be disposed at regular intervals. Accordingly, even if the sense amplifier regions 410 and 420 are disposed apart from each other in the same memory region, the bit lines BL may be formed at regular intervals without varying the length of the bit lines or degrading the density of the bit lines, so the integration density of a memory may not be degraded. A logic region 600 may be disposed in the remaining region of the memory region M in which the word line driver regions 510 and 520 and the sense amplifier regions 410 and 420 are disposed.

When the sense amplifier regions 410 and 420 and the word line driver regions 510 and 520 are disposed as in the present embodiment, the bit lines BL or word lines WL may be formed at regular intervals without cutting the bit lines BL or the word lines WL or forming the bit lines BL or the word lines WL in a roundabout way so that the integration density of memory cells cannot be degraded. When a plurality of first substrates are stacked, the sense amplifier region 410 and 420, the word line driver regions 510 and 520, and the logic region 600 are disposed in the memory region M of the second substrate 200, a die size may be reduced by as much as the sense amplifier regions 410 and 420 and the logic region 600 as compared with the related art.

Figure 5:
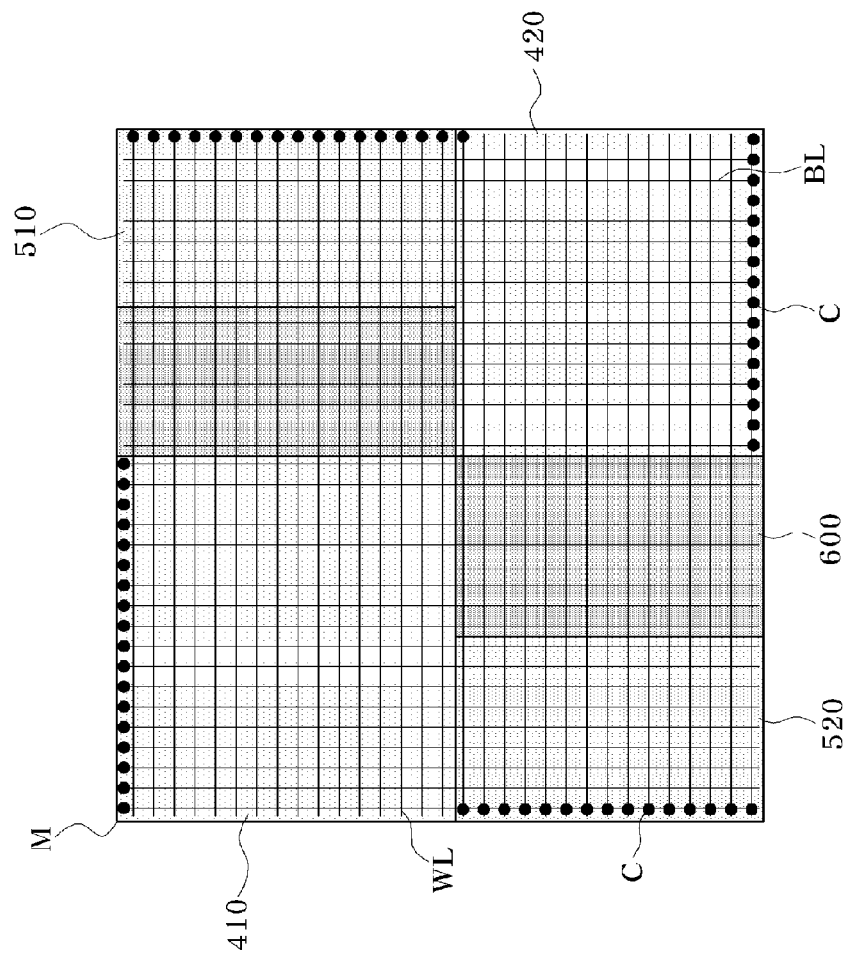
FIG. 5 is a schematic top view of a unit memory array including a sense amplifier region, a word line driver region, and a logic region disposed in a single memory region of a second substrate.
Figure 6:
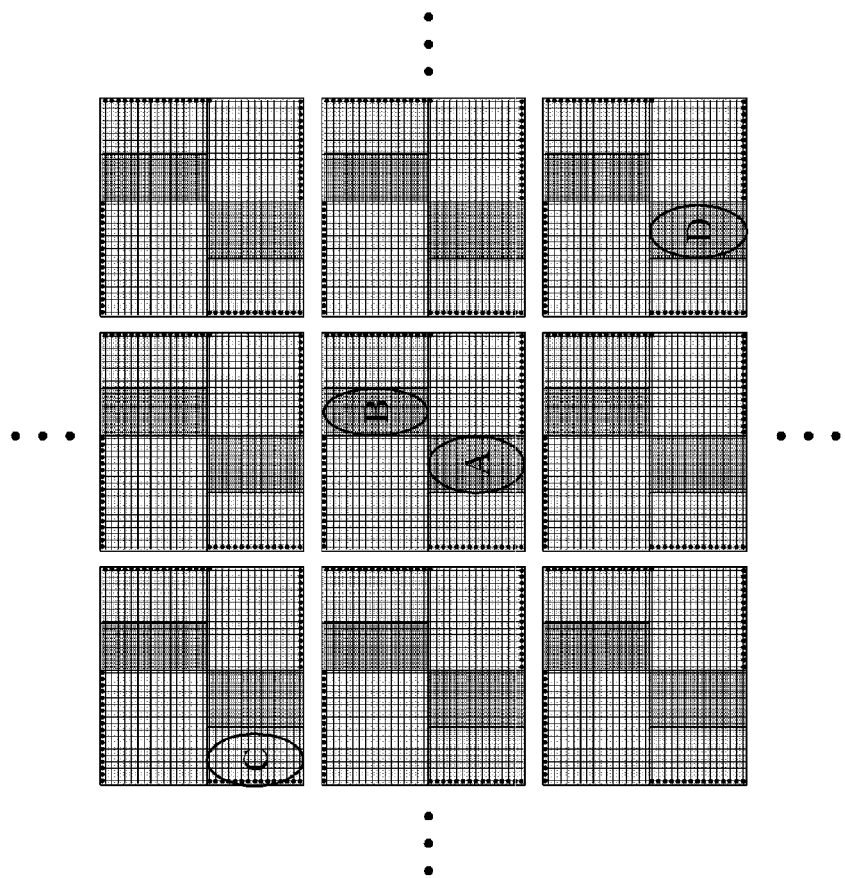
FIG. 6 is a schematic diagram showing that unit memory arrays according to a comparative example shown in FIG. 5 are arranged as a matrix type.

Hereinafter, bit lines according to an exemplary embodiment of the present invention will be described with reference to FIGS. 5, 6, 7A, 7B, and 7C, and 8. Here, a repeated description for the same arrangement as the bit lines according to the exemplary embodiment described above will be omitted for brevity. FIGS. 5 and 6 illustrate a comparative example for comparing with the exemplary embodiment of the present invention. FIG. 5 is a schematic top view illustrating a unit memory array including sense amplifier regions 410 and 420, word line driver regions 510 and 520, and a logic region 600 disposed in a single memory region M of a second substrate 200, and FIG. 6 is a schematic diagram showing that unit memory arrays, each of which is shown in FIG. 5 according to a comparative example, are arranged as a matrix type. Although word lines WL and bit lines BL are actually formed on first substrates stacked with a second substrate, the word lines WL and the bit lines BL are illustrated in FIGS. 5 and 6 for brevity. As shown in FIGS. 5 and 6, the word lines WL and the bit lines BL may be electrically connected to word line drivers of word line driver regions 510 and 520 and sense amplifiers of sense amplifier regions 410 and 420, which are disposed in a memory region M of the second substrate 200, through vertical conduction traces C.

Logic circuits disposed in the logic region 600 may transmit or receive power or control signals between unit memory arrays or in the unit memory arrays. Accordingly, the logic circuits disposed in the logic region 600 should be electrically connected to other logic regions, sense amplifier regions, or word line driver regions formed on the same second substrate 200. The electrical connection of the above-described logic region 600 with the other logic regions, the sense amplifier regions, or the word line driver regions may be performed using local interconnections.

Referring to FIG. 6, a logic region disposed in area A and a logic region disposed in area B may be easily electrically connected using a local interconnection. This is because an interlayer vertical conduction trace configured to penetrate the stacked first substrates and second substrate does not block a trace along which the local interconnection extends. However, when the logic region disposed in area A is electrically connected with a word line driver region disposed in area C, or the logic region disposed in area A is electrically connected with a logic region disposed in area D, it is difficult to make the connection for the regions because bit line vertical conduction traces and word line vertical conduction traces, which are crowded together, block the extension of local interconnections. In particular, when a large number of local interconnections are to be connected or when power transmission lines having large areas are used, the connection may be more difficult. When a distance between unit memory arrays is increased to solve difficulty in disposing lines, integration density may be degraded.

Figure 7:
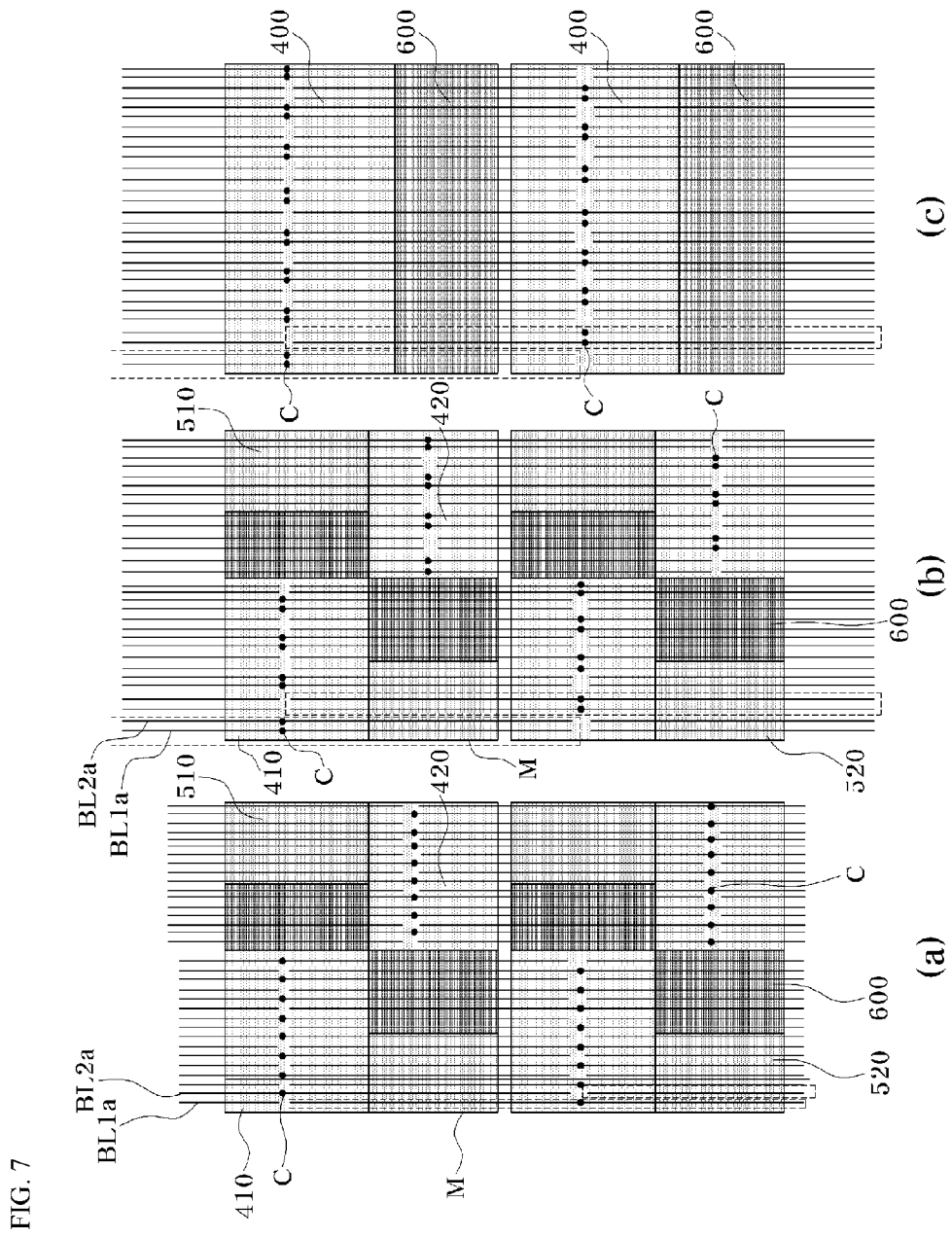
FIGS. 7A through 7C are schematic diagrams illustrating arrangement of bit lines according to an exemplary embodiment of the present invention.

FIGS. 7A through 7C are schematic diagrams illustrating arrangement of bit lines BL according to an exemplary embodiment of the present invention. In the present embodiment, at least one of bit lines disposed in a sense amplifier region may be electrically connected to a sense amplifier through a vertical conduction trace C, while the remaining bit lines may be electrically connected to sense amplifiers disposed adjacent to the remaining bit lines.

However, in the present specification, a meaning that a bit line is disposed in a sense amplifier region does not indicate that the bit line is formed in a sense amplifier region of a second substrate, but indicates that a position of a first substrate in which the bit line is formed overlaps the sense amplifier region of the second substrate, or penetrates the sense amplifier region of the second substrate. Accordingly, not only a bit line $BL_{2a}$ shown in FIG. 7A but also a bit line $BL_1a$ of FIG. 7A may be disposed in a sense amplifier region 410.

Referring to FIGS. 7A, 7B, and 7C, at least one of bit lines disposed in sense amplifier regions 410 and 420 may be electrically connected to sense amplifiers (not shown) disposed in the sense amplifier regions 410 and 420 through vertical conduction traces C. However, when all bit lines disposed in the sense amplifier regions 410 and 420 are connected to the sense amplifiers through the vertical conduction traces C, a degree of freedom for local interconnections may be extremely limited as shown in FIG. 5. Accordingly, bit lines having the same length may be grouped to form one or more bit line groups, and the bit line groups may be alternately disposed. The formed bit line group may be connected to the sense amplifier through the vertical conduction trace C. Similarly, a predetermined number of bit lines, which are not connected to the sense amplifiers through the vertical conduction trace C, may be electrically connected to a sense amplifier disposed adjacent to the corresponding sense amplifier in a direction in which the bit lines extend.

In an example, as illustrated with dotted lines in FIG. 7A, each of bit line groups may include a single bit line, and the formed bit line groups may be alternately disposed. In another example, as illustrated with dotted lines in FIG. 7B, each of bit line groups may include two bit lines, and the formed bit line groups may be alternately disposed. In still another example, although not shown, it may be possible that each of bit line groups include at least three bit lines and the bit line groups are alternately disposed. In still another example, as shown in FIG. 7C, even when the sense amplifier region 400 is not divided but disposed in the memory region, bit lines may be alternately disposed.

Figure 8:
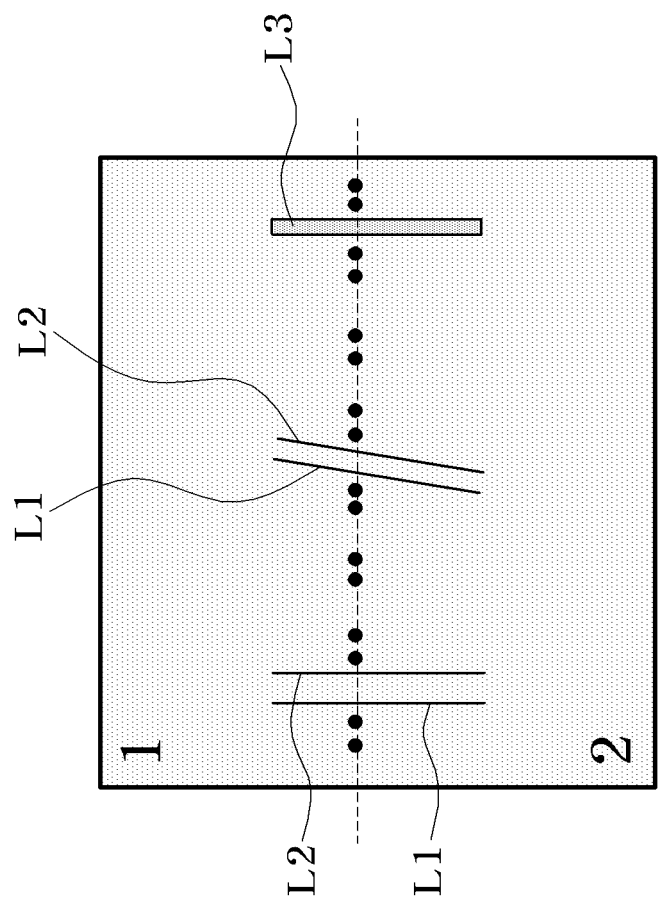
FIG. 8 is a diagram illustrating one sense amplifier region of a memory according to an exemplary embodiment of the present invention, in which identical bit lines are grouped by two and the grouped bit lines are alternately disposed.

FIG. 8 is a diagram of one sense amplifier region of a memory according to an exemplary embodiment of the present invention, in which identical bit lines are grouped by two and are alternately disposed. The illustration of bit lines is omitted for brevity, and only vertical conduction traces and local interconnections L1 and L2 by which bit lines and sense amplifiers are electrically connected are illustrated. Local interconnections may be disposed in the vicinity of the vertical conduction traces. When the vertical conduction traces are crowded and disposed in a row as shown in FIG. 5, local interconnections cannot pass between the vertical conduction traces. However, when the bit lines are arranged according to the embodiment of the present invention, the local interconnections may be formed around the vertical conduction traces across regions 1 and 2 partitioned by the vertical conduction traces.

Thus, the local interconnections L1 and L2 may be disposed vertical to a portion in which the vertical conduction trace is formed, as shown in a left portion of FIG. 8, or disposed at a predetermined angle to the portion in which the vertical conduction trace is formed, as shown in a middle portion of FIG. 8. Furthermore, as shown in a right portion of FIG. 8, a local interconnection L3 having a large area may be freely disposed to transmit power. By alternately disposing bit lines having the same length and disposing vertical conduction trances configured to electrically connect the bit lines with sense amplifier regions, information stored in memory cells disposed in all memory regions may be transmitted without errors, and a degree of freedom for local interconnections may be improved. In addition, a vertical conduction trace C configured to connect the sense amplifier region with the bit lines may be disposed in a central portion of the sense amplifier region as shown in FIGS. 7A through 7C. Alternatively, although not shown, a vertical conduction trace may be disposed in a peripheral portion of the sense amplifier region.

Figure 9:
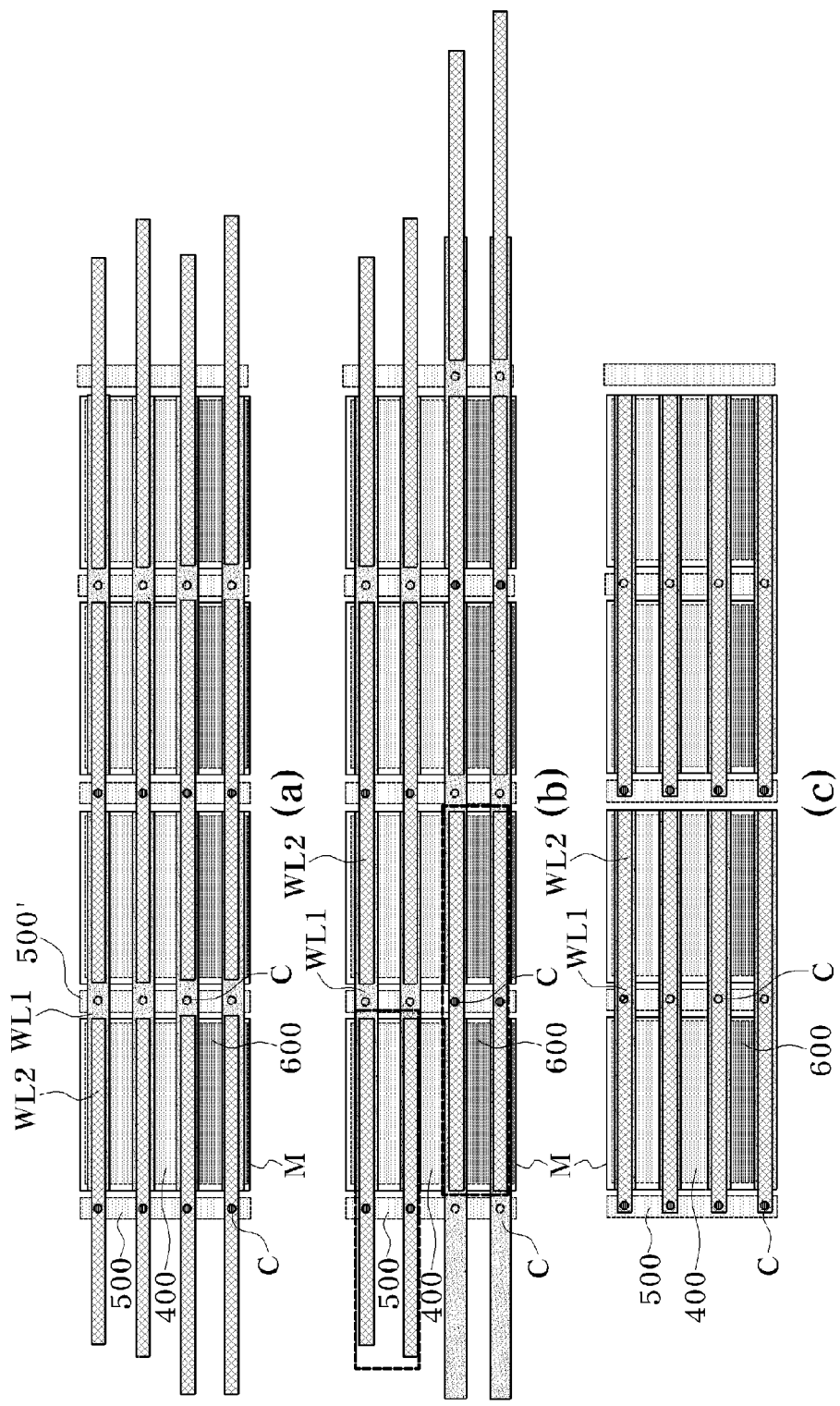
Figure 10:
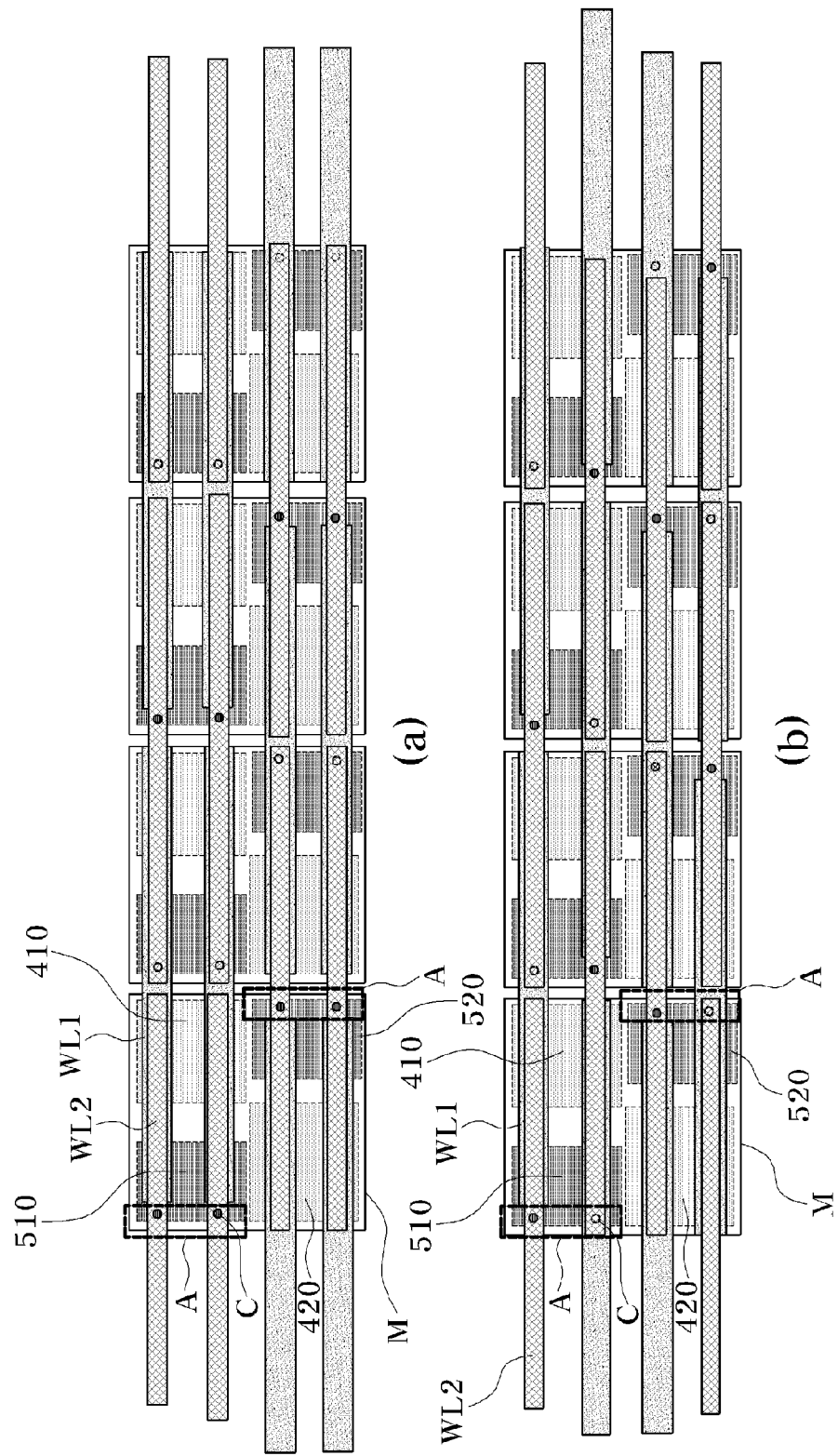

Hereinafter, arrangement of word lines according to an exemplary embodiment of the present invention will be described with reference to FIGS. 9A through 9C. A repeated description for the same configuration or arrangement as the word lines described above will be omitted for brevity. FIGS. 9A through 12B illustrate a memory region M of a second substrate on which a sense amplifier region 400, a word line driver region, and a logic region are disposed as a matrix type and word lines $WL_1$ and $WL_2$ formed on a first substrate, according to an exemplary embodiment of the present invention. The illustration of bit lines and memory cells is omitted in FIGS. 9A through 12B for brevity. Also, although only several word lines are illustrated, it will be understood to those skilled in the art that a plurality of word lines may be arranged according to the same rules. Furthermore, although it is illustrated for brevity that the width of the word line $WL_1$ of a first substrate 100b stacked over a second substrate 200 with an insulating layer therebetween is greater than the width of the word line $WL_2$ of a first substrate 100a stacked with the first substrate 100b, word lines of the first substrates 100a and 100b may have substantially the same width.

Referring to FIG. 9A, word lines $WL_1$ and $WL_2$ according to the present embodiment may be electrically connected to two unit memory arrays disposed adjacently in a direction in which word lines extend. Also, the word lines $WL_1$ and $WL_2$ may be electrically connected to word line drivers of the word line driver region 500 disposed between two adjacent unit memory regions M through vertical conduction traces C. The word lines $WL_1$ and $WL_2$ may be electrically connected to unit memory cells of two unit memory arrays disposed adjacently in the direction in which the word lines $WL_1$ and $WL_2$ extend, and drive unit memory cells.

When the word line $WL_2$ located in the first substrate 100a disposed in an upper layer and the word line $WL_1$ located in the first substrate 100b disposed in a lower layer are disposed in the same position and vertical conduction traces C are respectively located in central portions of the word lines $WL_1$ and $WL_2$, the vertical conduction traces C may be electrically connected to each other so that driving signals cannot be independently transmitted to memory cells. Thus, the word lines $WL_2$ and $WL_1$ may be alternately disposed in different layers. Accordingly, the word lines $WL_1$ and $WL_2$ may not be electrically connected to each other but be electrically connected to word line drivers disposed on the second substrate so that memory arrays disposed in respective layers can be independently driven.

In one embodiment, as shown in FIG. 9A, word lines may be disposed such that word line drivers of one word line driver region 500 drive only memory arrays disposed in one layer. Accordingly, the word line drivers of the word line driver region 500 may be electrically connected to word lines $WL_2$ of a first substrate 100a disposed in an upper layer, and word line drivers of a word line driver region 500' may be electrically connected to word lines $WL_1$ of a first substrate 100b disposed in a lower layer. In the present embodiment, word lines of two adjacent unit memory arrays may be connected to a word line driver region interposed between the two adjacent unit memory arrays through a vertical conduction trace.

In another embodiment, as shown in FIG. 9B, word lines may be disposed such that word line drivers of one word line driver region 500 are connected to word lines disposed in different layers. That is, when word lines are grouped by two to form word line groups and the word line groups are alternately disposed in the same layer, word line drivers disposed in one word line driver region 500 may be electrically connected to word lines $WL_1$ and $WL_2$ disposed in different layers. Although the present embodiment illustrates and describes a case in which each of the word line groups includes two word lines for brevity, it may be possible that each of the word line groups includes at least three word lines and the word line groups are alternately disposed.

Referring to FIG. 9C, a word line according to the present embodiment may be electrically connected to unit memory cells of two adjacent unit memory arrays. Also, a word line $WL_1$ disposed in one layer may be electrically connected to a word line driver through a vertical conduction trace C formed in a word line central portion, and apply a driving signal to unit memory cells electrically connected to the corresponding word line $WL_1$, and a word line $WL_2$ disposed in another layer may be electrically connected to the word line driver through a vertical conduction trace C formed in one end portion of the word line $WL_2$.

In the present embodiment, in order to prevent electrical connection of a vertical conduction trace of the word line $WL_2$ of the first substrate 100a disposed in the upper layer with the word line $WL_1$ of the first substrate 100b disposed in the lower layer, when a vertical conduction trace C is disposed in one end portion of the word line $WL_2$ and a vertical conduction trace C is disposed in a central portion of the word line $WL_1$, word lines disposed in the upper layer may not be electrically connected to word lines disposed in the lower layer. Also, word line drivers disposed in one word line driver region may be electrically connected to word lines disposed in the same layer as the word line drivers so that memory arrays disposed in respective layers can be driven independently.

In the present embodiment, although not shown, when each of word line groups includes at least two word lines and each of the word line groups are alternately disposed in the same layer, word line drivers disposed in one word line driver region may be electrically connected to word lines disposed in different layers so that memory arrays can be driven independently.

Hereinafter, arrangement of word lines according to an exemplary embodiment of the present invention will be described with reference to FIGS. 10A and 10B. Here, a repeated description for the same configuration or arrangement as the word lines described above will be omitted for brevity. FIGS. 10A and 10B illustrate a memory region M of a second substrate in which sense amplifier regions 410 and 420, word line driver regions 510 and 520, and a logic region (not shown) are disposed as a matrix type, and word lines WL1 and WL2 formed on first substrates 100a and 100b, according to exemplary embodiments of the present invention. The illustration of bit lines and unit memory cells is omitted in FIGS. 10A and 10B for brevity. Also, although only several word lines are illustrated, it will be understood to those skilled in the art that a plurality of word lines may be arranged according to the same rules. Furthermore, although it is illustrated for brevity that the width of the word line $WL_1$ of the first substrate 100b stacked over the second substrate with an insulating layer therebetween is greater than the width of the word line $WL_2$ of the first substrate 100a stacked with the first substrate 100b, word lines of the first substrates 100a and 100b may have substantially the same width.

Referring to FIG. 10A, the word lines $WL_1$ and $WL_2$ according to the present embodiment may be electrically connected to two unit memory arrays disposed adjacently in a direction in which word lines extend. Thus, the word lines $WL_1$ and $WL_2$ may be electrically connected to one of word line drivers disposed in the memory region M of the second substrate through vertical conduction traces C. The word lines $WL_1$ and $WL_2$ may be electrically connected to unit memory cells of the two unit memory arrays disposed adjacently in the direction in which the word lines extend, and apply signals, which are transmitted by the word line drivers included in the word line driver regions 510 and 520 disposed in the memory region M, to the unit memory cells. In the present embodiment, the word lines $WL_1$ and $WL_2$ may be electrically connected to the word line drivers through the vertical conduction traces C disposed in the centers of the word lines, and apply driving signals to unit memory cells electrically connected to the corresponding word line.

When a word line $WL_2$ disposed in a first substrate 100a disposed in an upper layer and a word line $WL_1$ disposed in a first substrate 100b disposed in a lower layer are disposed in the same position and vertical conduction traces C are respectively disposed in central portions of the word lines $WL_2$ and $WL_1$, the vertical conduction traces C may be electrically connected to each other so that driving signals cannot be independently transmitted to memory cells. Thus, the word line $WL_2$ disposed in the first substrate 100a disposed in the upper layer and the word line $WL_1$ disposed in the first substrate 100b disposed in the lower layer may be alternately disposed in different layers as shown in FIG. 10A. Accordingly, the word line $WL_2$ disposed in the upper layer and the word line $WL_1$ disposed in the lower layer may not be electrically connected to each other but be electrically connected to the word line drivers of the word line driver regions 510 and 520 disposed on the second substrate so that memory arrays disposed in respective layers can be independently driven.

In an embodiment, as shown in FIG. 10A, word lines may be disposed such that a word line driver region disposed apart in one memory region M of a second substrate is electrically connected to a word line disposed on one of stacked first substrates. In another embodiment, as shown in FIG. 10B, word lines may be disposed such that one word line driver region disposed apart in one memory region is electrically connected to word lines disposed on first substrates stacked in different layers.

In another embodiment, although not shown, similar to that shown in FIG. 9C, a word line disposed in one layer may be electrically connected to a word line driver through a vertical conduction trace formed in a central portion of the word line, and apply a driving signal to unit memory cells electrically connected to the corresponding word line. A word line disposed in another layer may be electrically connected to a word line driver through a vertical conduction trace formed in one end portion of the word line.

According to the present embodiments, since a word line driver region is disposed in a memory region, a vertical conduction trace should penetrate a memory region of a first substrate stacked in a lower layer so that word lines disposed in a first substrate stacked in an upper layer and word lines disposed in the first substrate stacked in the lower layer can be electrically connected to a word line driver. Accordingly, since memory cells cannot be formed in portion A penetrated by the vertical conduction trace, predetermined area loss may occur.

However, according to the present embodiments, since the word line driver regions are divided in the direction in which the word lines extend, and disposed in the memory region of the second substrate, wherein the memory region of the second substrate corresponds to the memory region of the first substrate, a memory having a higher integration density may be formed as compared with the above-described area loss.

Figure 11:
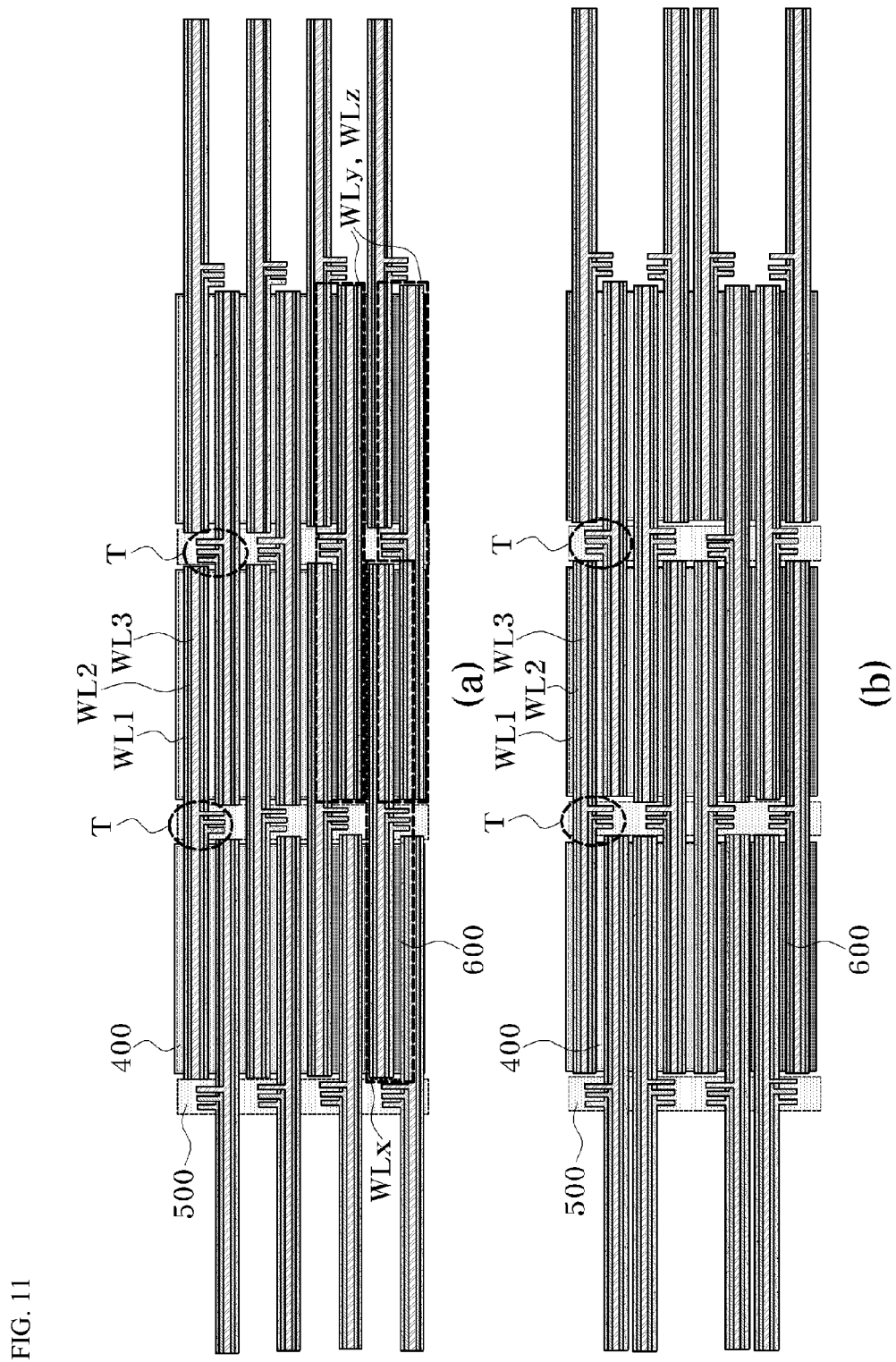
Figure 12:
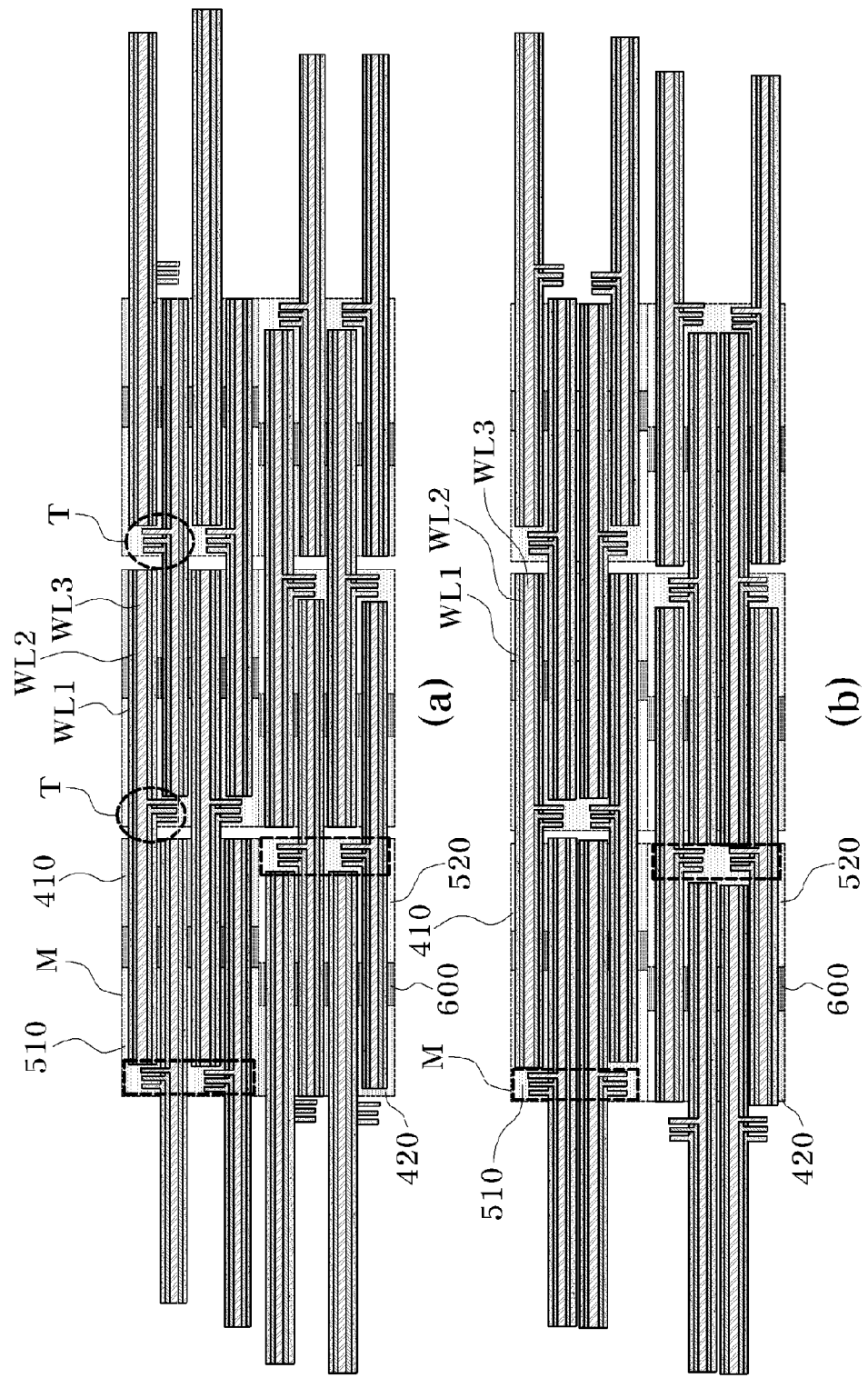

Hereinafter, arrangement of word lines according to an exemplary embodiment of the present invention will be described with reference to FIGS. 11A through 12B. Here, a repeated description for the same configuration or arrangement as the word lines described above will be omitted for brevity. FIGS. 11A and 11B illustrate a memory region M of a second substrate on which a sense amplifier region 400, a word line driver region 500, and a logic region 600 are disposed as a matrix type and word lines $WL_1$, $WL_2$, and $WL_3$ formed on three first substrates. The illustration of bit lines and unit memory cells is omitted in FIGS. 11A and 11B for brevity. Also, although only several word lines are illustrated, it will be understood to those skilled in the art that a plurality of word lines may be arranged according to the same rules. Furthermore, although it is illustrated for brevity that a word line disposed in a lower layer has a greater width, the word lines $WL_1$, $WL_2$, and $WL_3$ may have substantially the same linewidth.

Referring to FIGS. 11A and 11B, a word line of a memory according to an exemplary embodiment of the present invention may be electrically connected to two adjacent unit memory arrays, and a tap may be formed in one direction from a direction in which word lines extend, and connected to a vertical conduction trace. In the present embodiment, a word line driver region 500 may be disposed between two adjacent memory regions disposed on a second substrate. The word lines $WL_1$, $WL_2$, and $WL_3$ may be electrically connected to two adjacent unit memory arrays disposed in the direction in which the word lines extend, and drive unit memory cells disposed in the unit memory arrays. A vertical conduction trace (not shown) may be disposed between two adjacent unit memory arrays disposed in the direction in which the word lines extend. One end of the vertical conduction trace may be connected to a word line driver, while the other end thereof may be connected to a tap T of the word line. When taps formed in word lines disposed in respective layers are in the same position, the word lines formed in the respective layers may be electrically connected to one another through a vertical conduction trace. Therefore, taps of word lines disposed in different layers may be disposed in different positions in the direction in which the word lines extend. Furthermore, in one embodiment, a tap may be formed at an angle to the direction in which the word lines extend. In an example, a tap may be formed vertical to the direction in which the word lines extend.

In an embodiment, as shown in FIGS. 11A and 11B, taps of word lines adjacently disposed in a direction in which word lines are arranged may be formed in different directions. That is, when a tap of one word line $WL_x$ is formed to protrude downward, taps $WL_y$ and $WL_z$ formed in word lines adjacently disposed in a direction in which the corresponding word line is arranged may be disposed to protrude in an opposite direction, namely, upward. Furthermore, a tap may be disposed in a central portion of a word line. Accordingly, taps of word lines adjacently disposed in the direction in which the word lines are arranged may be arranged between word lines adjacently disposed in the direction in which the word lines extend, and thus area loss may be reduced. Also, although two word lines adjacently disposed in the direction in which the word lines are arranged may be arranged parallel to each other as shown in FIG. 11A, the two word lines may be alternately disposed as shown in FIG. 11B.

Hereinafter, word lines according to another exemplary embodiment of the present invention will be described with reference to FIGS. 12A and 12B. Referring to FIGS. 12A and 12B, in the present embodiment, a second substrate may include a plurality of word line driver regions 510 and 520 divided parallel to a direction in which word lines $WL_1$, $WL_2$, and $WL_3$ extend, and disposed in a memory region M of the second substrate, and a vertical conduction trace (not shown) configured to electrically connect the word lines $WL_1$, $WL_2$, and $WL_3$ with a word line driver disposed in the memory region M of the second substrate. The word lines $WL_1$, $WL_2$, and $WL_3$ may be electrically connected to two adjacent unit memory arrays, and a tap T may be formed in one direction from the direction in which the word lines $WL_1$, $WL_2$, and $WL_3$ extend, and connected to the vertical conduction trace.

Referring to FIGS. 12A and 12B, in the present embodiment, word driver regions 510 and 520 may be disposed apart from each other in the direction in which the word lines extend in the memory region M of the second substrate. The word lines $WL_1$, $WL_2$, and $WL_3$ may be electrically connected to two unit memory arrays adjacently disposed in the direction in which the word lines extend, and drive unit memory cells disposed in the unit memory arrays. Word line drivers (not shown) may be disposed in the word line driver regions 510 and 520, and electrically connected to taps T of the word line drivers through vertical conduction traces. When taps formed in word lines stacked in respective layers are in the same position, the word lines formed in the respective layers cannot be independently connected to one another through a vertical conduction trace. Thus, taps of word lines of first substrates stacked in different layers may be formed in different positions. In one embodiment, a tap may be formed at an angle to the direction in which the word lines extend. In an example, a tap may be formed vertical to the direction in which the word lines extend.

In an embodiment, taps of word lines adjacently disposed in a direction in which word lines are arranged may be formed in different directions. That is, when a tap T of one word line is formed to protrude upward, taps disposed in word lines adjacently disposed in a direction in which the corresponding word line is arranged may be disposed to protrude in an opposite direction, namely, downward. Furthermore, a tap may be disposed in a central portion of a word line. Accordingly, taps of word lines adjacently disposed in the direction in which the word lines are arranged may be arranged between word lines adjacently disposed in a direction in which the word lines extend, and thus area loss may be reduced. Also, although two word lines adjacently disposed in the direction in which the word lines are arranged may be arranged parallel to each other as shown in FIG. 10A, the two word lines may be alternately disposed as shown in FIG. 10B.

According to the present embodiments, since a word line driver region is disposed in a memory region, word lines disposed on a first substrate stacked in an upper layer should penetrate a memory array of a first substrate stacked in a lower layer as shown so that the word lines disposed on the first substrate stacked in the upper layer can be electrically connected to a word line driver disposed on a second substrate. Accordingly, since memory cells cannot be formed in a portion penetrated by a vertical conduction trace as illustrated with a dotted line, area loss may occur as described above. However, as explained above, since memory capacity loss caused by the area loss is slight as compared with a memory capacity obtained by further stacking and integrating an additional first substrate, a memory having a higher integration density may be formed as compared with the above-described area loss.

According to exemplary embodiments of the present invention, since a sense amplifier region and a logic region are disposed in a memory region of a second substrate and a first substrate is stacked with the second substrate, a memory having a high information storage density can be formed. Also, word line driver regions can be divided in a direction in which word lines extend, and disposed in the memory region so that a memory having a further higher information storage density can be formed.

According to exemplary embodiments of the present invention, bit lines having the same length can be alternately disposed, and vertical conduction traces can be disposed to electrically connect the bit lines with a sense amplifier region. Information stored in memory cells disposed in all memory regions can be transmitted to sense amplifiers without errors, and a degree of freedom for local interconnections can be improved.

According to exemplary embodiments of the present invention, word lines disposed in respective layers can be alternately disposed so that a word line driver can independently drive memory arrays disposed in respective layers.

According to exemplary embodiments of the present invention, taps are disposed in word lines and the taps disposed in respective layers can be formed in different positions so that a word line driver can independently drive memory arrays disposed in respective layers.

Typical exemplary embodiments of the invention are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the present invention as defined by the following claims. For example, it will be understood that even if other orders, systems, structures, apparatuses, and/or circuits than in the above-described embodiments are combined in different ways or components of the above-described embodiments are supplemented or replaced with other components or equivalents thereof, uniform effects may be obtained.

What is claimed is:

1. A memory comprising:
   at least one first substrate on which unit memory arrays are disposed in a memory region as a matrix type, each unit memory array including unit memory cells disposed in an array;
   a second substrate stacked with the at least one first substrate, the second substrate including a sense amplifier region in which sense amplifiers configured to sense information stored in the unit memory cells are disposed; and
   a plurality of vertical conduction traces configured to electrically connect the at least one first substrate with the second substrate,
   wherein the sense amplifier region is disposed in a memory region of the second substrate, wherein the memory region of the second substrate corresponds to the memory region of the first substrate,
   wherein bit lines are connected to the sense amplifier through the vertical conduction traces.

2. The memory according to claim 1, wherein the unit memory arrays are disposed as the matrix type in a direction in which word lines extend, and a word line driver region in which word line drivers are disposed is interposed between the memory region of the second substrate.

3. The memory according to claim 1, wherein the memory region of the second substrate further comprises a word line driver region in which word line drivers configured to apply a driving signal to the unit memory cells through word line are disposed.

4. The memory according to claim 3, wherein word line driver regions are divided parallel to a direction in which word lines extend, and disposed in the memory region of the second substrate, and
   sense amplifier regions are divided parallel to a direction in which bit lines extend, and disposed in the memory region of the second substrate.

5. The memory of claim 2, wherein the word lines are connected to the word line driver through the vertical conduction traces.

6. A memory comprising:
   at least one first substrate on which unit memory arrays are disposed in a memory region of first substrate as a matrix type, each unit memory array in which unit memory cells are disposed in an array; and
   a second substrate having sense amplifier region in which sense amplifiers that sense information stored in unit memory cells are disposed within a memory region of the second substrate;
   wherein at least one bit line of bit lines disposed in the sense amplifier region is electrically connected to the sense amplifiers disposed in the sense amplifier region, through vertical conduction traces, and the remaining bit lines are electrically connected to sense amplifiers disposed in a sense amplifier region disposed adjacent to the sense amplifier region in which the at least one bit line is disposed,
   wherein the memory region of the second substrate corresponds to the memory region of the first substrate.

7. The memory according to claim 6, wherein the sense amplifier region is disposed in the memory region of the second substrate.

8. The memory according to claim 6, wherein sense amplifier regions are divided in a direction in which the bit lines extend, and disposed in the memory region of the second substrate.

9. The memory according to claim 6, wherein the bit lines are grouped into a predetermined number of bit line groups and the predetermined number of bit line groups are alternately disposed.

10. The memory according to claim 6, further comprising a local interconnection which is not electrically connected to a vertical conduction trace but disposed across the sense amplifier region partitioned by arranging the vertical conduction traces.

11. A memory comprising:
a plurality of first substrates, each first substrate on which unit memory arrays are disposed in a memory region of each first substrate as a matrix type, each unit memory array including unit memory cells and word lines configured to drive the unit memory cells; and
a second substrate stacked with the plurality of first substrates and including memory regions of the second substrate between which a word line driver region is disposed in a direction in which the word lines extend,
wherein the word lines are electrically connected to two adjacent unit memory arrays and electrically connected to word line drivers of the word line driver region disposed between the two adjacent memory regions, through vertical conduction traces,
wherein a position of the memory region of the first substrate and a position of the memory region of the second substrate corresponds to each other.

12. The memory according to claim 11, wherein the word line drivers of the word line driver region are electrically connected to word lines disposed in at least one layer of stacked first substrates.

13. A memory comprising:
a plurality of first substrates, each first substrate on which unit memory arrays are disposed in a memory region of the first substrate as a matrix type, each unit memory array including unit memory cells and word lines configured to drive the unit memory cells; and
a second substrate stacked with the plurality of first substrates, the second substrate including a plurality of word line driver regions divided parallel to a direction in which the word lines extend, and disposed in a memory region of a memory region of the second substrate,
wherein the word lines are electrically connected to two adjacent unit memory arrays, and electrically connected to any one word line driver disposed in a memory region of the adjacent unit memory arrays, through vertical conduction traces,
wherein a position of the memory region of the first substrate and a position of the memory region of the second substrate corresponds to each other.

14. The memory according to claim 13, wherein the word line driver region in which the word line driver electrically connected to the word lines through the vertical conduction traces is disposed is a word line driver region disposed below central portions of the word lines.

15. The memory according to claim 13, wherein word lines of stacked first substrates are alternately disposed.

16. The memory according to claim 13, wherein the vertical conduction traces are electrically connected to the central portions of the word lines.

17. The memory according to claim 13, wherein the vertical conduction traces are in contact with one end portions of the word lines.

18. A memory comprising:
a plurality of first substrates, each first substrate on which unit memory arrays are disposed in a memory region of the first substrate as a matrix type, each unit memory array including unit memory cells and word lines configured to apply driving signals configured to drive the unit memory cells;
a second substrate stacked with the plurality of first substrates, the second substrate including a plurality of word line driver regions divided parallel to a direction in which the word lines extend, and disposed in a memory region of the second substrate; and
a vertical conduction trace configured to electrically connect the word line with the word line driver disposed in the memory region,
wherein the word lines are electrically connected to two adjacent unit memory arrays, and a tap is formed in one direction from a direction in which the word lines extend, and connected to the vertical conduction trace,
wherein a position of the memory region of the first substrate and a position of the memory region of the second substrate corresponds to each other.

19. The memory according to claim 18, wherein a tap formed in one word line is disposed in an opposite direction to a tap formed in another word line disposed directly adjacent to the one word line.

20. The memory according to claim 19, wherein taps formed in word lines disposed in different layers are spaced a predetermined distance apart from one another in the direction in which the word lines extend.

* * * * *